(12) United States Patent
Chiu et al.

(10) Patent No.: US 12,062,625 B2
(45) Date of Patent: Aug. 13, 2024

(54) SEMICONDUCTOR DEVICE PACKAGE MOLD FLOW CONTROL SYSTEM AND METHOD

(71) Applicant: Western Digital Technologies, Inc., San Jose, CA (US)

(72) Inventors: Hope Chiu, Shanghai (CN); Hua Tan, Shanghai (CN); Kent Yang, Hsinchu (TW); Weiting Jiang, Shanghai (CN); Jerry Tang, Shanghai (CN); Simon Dong, Shanghai (CN); Yuequan Shi, Shanghai (CN); Rosy Zhao, Shanghai (CN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 131 days.

(21) Appl. No.: 17/490,279

(22) Filed: Sep. 30, 2021

(65) Prior Publication Data
US 2023/0102959 A1  Mar. 30, 2023

(51) Int. Cl.
| | |
|---|---|
| *H01L 23/00* | (2006.01) |
| *H01L 21/48* | (2006.01) |
| *H01L 21/56* | (2006.01) |
| *H01L 23/31* | (2006.01) |
| *H01L 25/065* | (2023.01) |

(52) U.S. Cl.
CPC .......... *H01L 23/562* (2013.01); *H01L 21/481* (2013.01); *H01L 21/56* (2013.01); *H01L 23/3121* (2013.01); *H01L 25/0657* (2013.01); *H01L 2225/06506* (2013.01); *H01L 2225/0651* (2013.01)

(58) Field of Classification Search
CPC ............................................ H01L 2224/03013
See application file for complete search history.

(56) References Cited

U.S. PATENT DOCUMENTS

| | | | |
|---|---|---|---|
| 2008/0164618 A1* | 7/2008 | Chow ................. | H01L 23/3121 438/126 |
| 2012/0193802 A1* | 8/2012 | Chiu ...................... | H01L 23/24 257/773 |

* cited by examiner

*Primary Examiner* — Yu-Hsi D Sun
(74) *Attorney, Agent, or Firm* — Morgan, Lewis & Bockius LLP

(57) ABSTRACT

A semiconductor package includes a substrate having a top planar surface and a semiconductor die mounted on the top planar surface of the substrate. Bond wires electrically connect the semiconductor die to the substrate. Flow control dams are integrally formed with the top planar surface of the substrate and each flow control dam protrudes from the top planar surface of the substrate at a location proximate to the bond wires. The flow control dams reduce the occurrence of wire sweep in the bond wires electrically connected to the substrate and semiconductor die.

19 Claims, 7 Drawing Sheets

SEMICONDUCTOR DEVICE PACKAGE MOLD FLOW CONTROL SYSTEM AND METHOD

BACKGROUND

The present disclosure generally relates to packaging for semiconductor devices and assembly thereof and, more particularly, to a packaged device having mold flow control dams and methods of assembly thereof.

Semiconductor device packages typically include one or more integrated circuit (IC) dies (e.g., NAND dies, ASIC dies, controller dies, etc.) and/or other semiconductor devices that are electrically coupled to a substrate. These dies may be electrically connected to the substrate, for example, with bond wires that convey electrical signals between the dies and bond pads located on the substrate. Bond wires are typically aligned in a horizontal plane such that each individual bond wire does not contact adjacent bond wires. The dies and bond wires are often encapsulated by a mold compound (e.g., an epoxy resin) that protects the dies and bond wires by creating a moisture barrier to prevent physical, chemical and/or electrical damage to the components. During assembly, the mold compound, in a fluid state, is flowed along one or more flow paths over the dies and the bond wires such that the dies and bond wires are encapsulated by the mold compound. The mold compound may then be cured or hardened to form a solid encapsulation around these components. However, flowing the mold compound often leads to the occurrence of "wire sweep" in which the bond wires are displaced from their original alignment in the horizontal plane, causing one or more of the bond wires to physically contact one or more adjacent bond wires causing a short in said bond wires. As the number of dies increases (e.g., as more dies are stacked one on top of another), the risk of wire sweep occurrence increases as well.

Therefore, there is a need to provide a semiconductor package that includes a mold flow control system to prevent or reduce the occurrence of wire sweep.

SUMMARY

In one embodiment there is a semiconductor package including a substrate having a top planar surface, a semiconductor die mounted on the top planar surface and electrically connected to the substrate by one or more bond wires, and one or more flow control dams integrally formed with the top planar surface of the substrate, each of the one or more flow control dams protruding from the top planar surface at a location proximate to the one or more bond wires. In some embodiments, the one or more flow control dams are formed from a solder mask integrally formed with the top planar surface of the substrate. In some embodiments, the semiconductor package further includes a mold compound encapsulating the semiconductor die and the one or more bond wires and the one or more flow control dams are configured to reduce the occurrence of wire sweep of the one or more bond wires.

In some embodiments, the one or more flow control dams includes a first flow control dam positioned on a first side of the one or more bond wires and a second flow control dam positioned on a second side of the one or more bond wires opposite the first side. In some embodiments, the first flow control dam and the second flow control dam each extend along respective longitudinal axes that are generally perpendicular to a proximal edge of the semiconductor die. In some embodiments, the one or more flow control dams are positioned proximate a corner of the semiconductor die. In some embodiments, the one or more flow control dams each extend along a respective longitudinal axis that is at an oblique angle relative to a proximal edge of the one or more semiconductor dies.

In some embodiments, the semiconductor die includes a proximal edge, a distal edge opposite the proximal edge, and a first lateral edge and a second lateral edge extending between the proximal edge and the distal edge. The one or more flow control dams include a first flow control dam and a second flow control dam each positioned proximate the proximal edge of the semiconductor die, a third flow control dam and a fourth flow control dam each positioned proximate the distal edge of the semiconductor die, a fifth flow control dam positioned proximate the first lateral edge of the semiconductor die, and a sixth flow control dam positioned proximate the second lateral edge of the semiconductor die. In some embodiments, each of the one or more flow control dams are positioned between a first plurality of the bond wires and a second plurality of the bond wires. In some embodiments, the one or more flow control dams have a generally cubic shape, rectangular shape, spherical shape, cylindrical shape, pyramidal shape, conical shape, amorphous shape, or combinations thereof.

In another embodiment there is a semiconductor package including a substrate having a top planar surface, at least one semiconductor die mounted on the top planar surface, one or more bond wires electrically connecting the at least one semiconductor die and the substrate, a mold compound encapsulating the at least one semiconductor die and the one or more bond wires, and one or more flow control dams integrally formed with the top planar surface of the substrate, wherein the one or more flow control dams are configured to reduce the occurrence of wire sweep of the one or more bond wires. In some embodiments, the one or more flow control dams are formed from a solder mask integrally formed with the top planar surface of the substrate. In some embodiments, the one or more flow control dams includes a first flow control dam positioned on a first side of the one or more bond wires and a second flow control dam positioned on a second side of the one or more bond wires opposite the first side.

In some embodiments, the one or more flow control dams are positioned proximate a corner of the at least one semiconductor die. In some embodiments, the one or more flow control dams each extend along a respective longitudinal axis that are at an oblique angle relative to a proximal edge of the at least one semiconductor die. In some embodiments, the one or more bond wires includes a first plurality of bond wires and a second plurality of bond wires and the one or more flow control dams are positioned between the first plurality of bond wires and the second plurality of bond wires.

In another embodiment, there is a method of forming a semiconductor package including providing a substrate having a top planar surface, laminating a solder mask layer on the top planar surface of the substrate such that the solder mask layer and substrate are integrally formed, forming one or more flow control dams from the solder mask layer by removing a portion of the solder mask layer, the one or more flow control dams integrally formed with the top planar surface of the substrate, mounting at least one semiconductor die on the top planar surface of the substrate, the at least one semiconductor die positioned such that the at least one semiconductor die does not directly contact the one or more flow control dams.

In some embodiments, the method further includes electrically connecting the at least one semiconductor die and the substrate with one or more bond wires, providing a mold compound to encapsulate the at least one semiconductor die and the one or more bond wires, and flowing the mold compound along a flow path defined by the one or more flow control dams such that the mold compound contacts the one or more flow control dams. At least a portion of the mold compound is deflected away from one or more bond wires by the one or more flow control dams, and the one or more flow control dams are configured to prevent wire sweep of the one or more bond wires from occurring during flowing of the mold compound. In some embodiments, the one or more flow control dams are positioned proximate a corner of the at least one semiconductor die. In some embodiments, the one or more flow control dams each extend along a respective longitudinal axis that are at an oblique angle relative to a proximal edge of the at least one semiconductor die.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
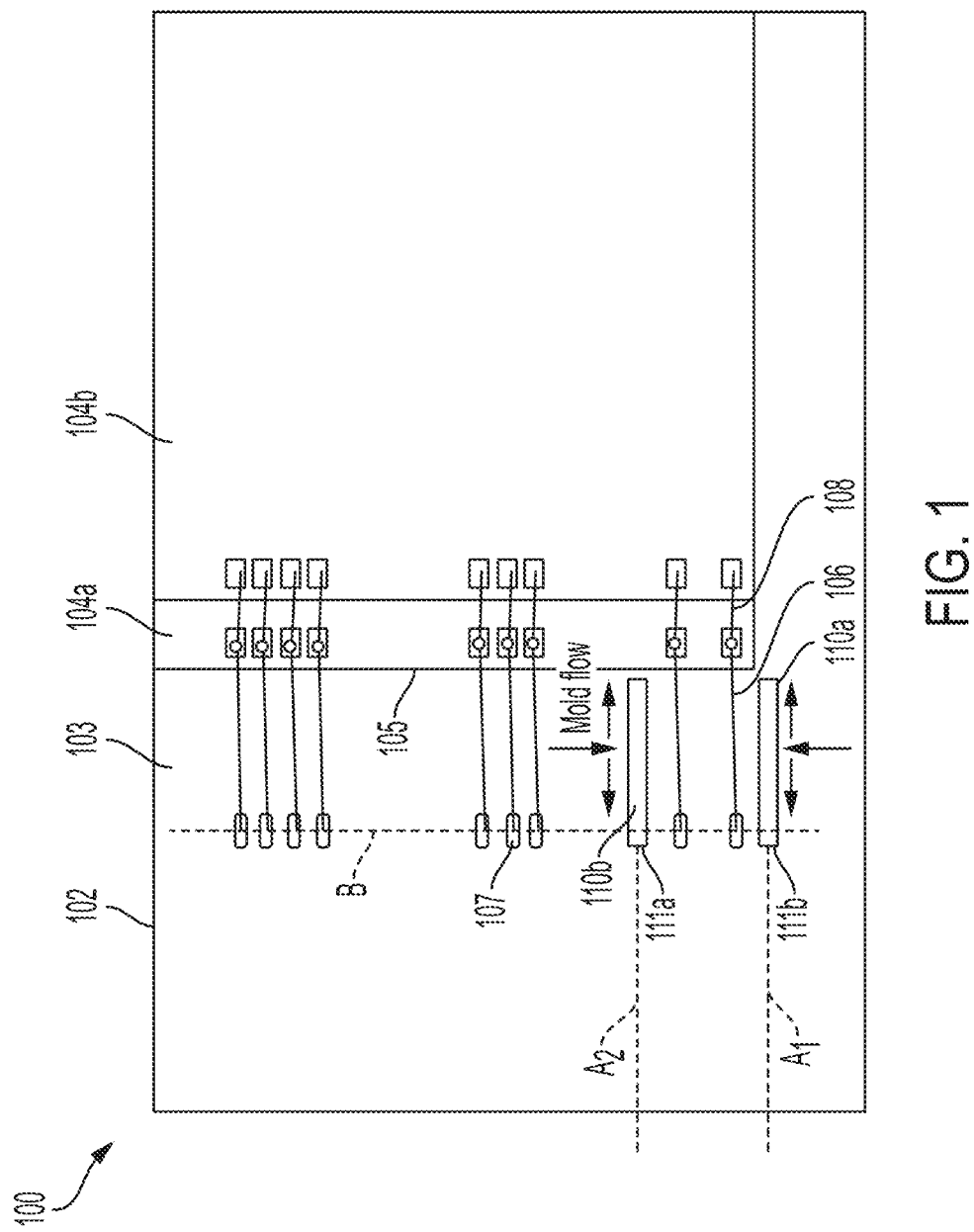
FIG. 1 is a top plan schematic view of a portion of a semiconductor package in accordance with an exemplary embodiment of the present disclosure.

Referring to FIG. 1 there is shown a portion of a semiconductor package, generally designated 100, in accordance with an exemplary embodiment of the present disclosure. The semiconductor package 100 may include a substrate 102, and one or more semiconductor dies 104a, 104b mounted on the substrate 102. The semiconductor dies 104a, 104b may be, for example, NAND dies or other memory chips for providing a storage amount. In FIG. 1, the semiconductor package 100 includes two stacked semiconductor dies 104a, 104b, where semiconductor die 104a is mounted to substrate 102 and semiconductor die 104b is stacked on top of semiconductor die 104a, however it will be understood that the semiconductor package 100 may include any number of semiconductor dies stacked or not stacked. For example, there may be one, two, three, four, five, six, seven, eight, nine, ten, eleven, twelve, thirteen, fourteen, fifteen, sixteen, or more than sixteen semiconductor dies stacked one upon another and mounted to substrate 102. In some embodiments, semiconductor die 104a is mounted on a top planar surface 103 of the substrate 102.

The substrate 102 may include one or more electrical connections (e.g., electrical wiring, signal traces, etc.), not shown, disposed within the substrate 102 to allow one or more components to be electrically connected to the substrate 102. In some embodiments, the substrate 102 includes one or more bond pads 107 in electrical communication with the one or more electrical connections. The one or more bond pads 107 may be positioned on the top planar surface 103 of substrate 102 such that the one or more components may be electrically connected to substrate 102. For example, the semiconductor die 104a may be electrically connected to the substrate 102 by one or more bond wires 106 connected to corresponding bond pads 107. In some embodiments, the one or more bond wires 106 are in electrical communication with the one or more electrical connections disposed within substrate 102 and to semiconductor die 104a. The one or more bond wires 106 may be electrically connected to semiconductor die 104a at a location proximate a proximal edge 105 of the semiconductor die 104a. For simplicity and ease of understanding, only a portion of the total number of bond wires are shown in the illustrated embodiment. In some embodiments, the semiconductor package 100 includes bond wires (not shown) electrically connected at a location proximate an edge of the semiconductor die 104a other than the proximal edge 105.

In some embodiments, the semiconductor package 100 includes die bond wires 108 electrically connecting each semiconductor die included in the semiconductor package 100 to one another. For example, semiconductor die 104a may be electrically connected to semiconductor die 104b by one or more die bond wires 108 wire bonded to each of semiconductor dies 104a, and 104b. The semiconductor package 100 shown in FIG. 1 includes two semiconductor dies 104a, 104b electrically connected by die bond wires 108. However, it will be understood that die bond wires 108 may electrically connect any number of semiconductor dies included in the semiconductor package 100. For example, the semiconductor package 100 may include sixteen semiconductor dies and each semiconductor die may be electrically connected one to another by die bond wires 108. In some embodiments, die bond wires 108 may be electrically connected (e.g., wire bonded) to a corresponding bond wire 106 such that each semiconductor die 104a, 104b included in the semiconductor package 100 is electrically coupled to the substrate 102. In some embodiments, bond wires 106 and/or die bond wires 108 may be comprised of a conductive material such as, for example, aluminum, copper, silver, gold, or a combination or alloy thereof. In some embodiments, bond wires 106 and/or die bond wires 108 have a diameter, for example, of about 15 micrometers.

In some embodiments, the semiconductor package 100 includes a mold compound (not shown) encapsulating the components (e.g., semiconductor dies 104, bond wires 106 and 108) of the semiconductor package 100. The mold compound may include, for example, ceramic, glass, thermoplastic materials, thermoset resins, or composites thereof. In some embodiments, the mold compound may be an epoxy mold compound (EMC) that includes a mixture of epoxy resins and one or more additives (e.g., curing agents, hardeners, accelerators, fillers, flame retardants, adhesion promoters, and/or pigments). The mold compound may encapsulate each semiconductor die 104a, 104b, each of bond wires 106, and die bond wires 108 and may cover at least a portion of the top planar surface 103 of substrate 102. During manufacturing, the mold compound may be introduced in a flowable state (e.g., in a liquid or semi-liquid state) to allow the liquid mold to flow over the substrate 102, bond wires 106, and semiconductor dies 104a, 104b. The mold compound may be subsequently cured or hardened to form a solid encapsulation around these components.

The semiconductor package 100 may include one or more flow control dams, generally designated 110, configured to reduce the occurrence of wire sweep of the one or more bond wires 106. The flow control dams 110 may protrude from the top planar surface 103 of substrate 102. In some embodiments, the one or more flow control dams 110 are integrally formed with the substrate 102. For example, the one or more flow control dams 110 may be formed with the substrate 102 such that there are no seams or separation between the top planar surface 103 of substrate 102 and where the flow control dams 110 protrude from said top planar surface 103. Put another way, the flow control dams 110 and substrate 102 are a unitary construct or that the flow control dams 110 and substrate 102 are formed into a single piece or unit. In some embodiments, the one or more flow control dams 110 are formed from a solder mask integrally formed with the top planar surface 103 of substrate 102.

In some embodiments, by providing flow control dams 110 integrally formed with the substrate 102 the cost and time to assemble the semiconductor package 100 may be reduced when compared to conventional semiconductor packages. For example, in conventional semiconductor packages, spacers may be included that space one or more dies from a top surface of the substrate. The spacers may also be used, at least partially, to define and control the flow of the molding compounds used to encapsulate components of the semiconductor packages. When using said spacers to at least partially control the mold flow, the spacers often require additional time to prepare and time to attach to the substrate which may include the use of die attach films (DAFs) that require additional time to cure. Additionally, by providing flow control dams 110 integrally formed with substrate 102, the shape and positioning of the flow control dams 110 may be more easily customized to better fit fluid mechanic requirements of the mold flow as compared to the use of spacers to, at least partially, control the mold flow. For example, the shape of spacers in conventional semiconductor packages may be limited to a generally rectangular shape and the positioning may be limited by the size and position of the semiconductor dies mounted on said spacers. As such, by providing flow control dams 110 integrally formed with the substrate 102, the flow control dams may take any shape (e.g., generally circular) and may be positioned at any location on the substrate 102. Although the above mentioned benefits of the integrally formed flow control dams 110 reference the semiconductor package 100 shown in FIG. 1, it will be understood that these benefits apply to any of the embodiments of a semiconductor package shown in FIGS. 1-4E.

Two flow control dams 110a and 110b are illustrated in FIG. 1, however there may be more or fewer flow control dams 110 in any given embodiment. The liquid mold compound may be flowed along one or more flow paths, which are illustrated by the arrows generally perpendicular to, and the arrows generally parallel to the flow control dams 110a, and 110b in FIG. 1. In some embodiments, the liquid mold compound is flowed along the flow paths such that the liquid mold compound flows over and encapsulates semiconductor dies 104a, 104b, bond wires 106 and die bond wires 108. The liquid mold compound may be cured or hardened such that the liquid mold compound hardens to protect the substrate 102, semiconductor dies 104a, 104b, bond wires 106 and/or die bond wires 108. In some embodiments, the flow paths are defined by the one or more flow control dams 110a, 110b respectively such that when the liquid mold compound is flowed over the substrate 102, the liquid mold compound contacts the one or more flow control dams 110a, 110b. In some embodiments, the one or more flow control dams 110a, 110b are configured to prevent wire sweep of the one or more bond wires 106 from occurring during flowing of the mold compound. For example, the one or more flow control dams 110a, 110b may deflect at least a portion of the mold compound away from one or more bond wires 106, thereby at least reducing the risk of wire sweep occurring. In some embodiments, the one or more flow control dams 110a, 110b may be configured to reduce the velocity, or flow rate, of the mold compound during assembly to prevent, or at least reduce, the occurrence of wire sweep. For example, the one or more flow control dams 110a, 110b may reduce the flow rate of the mold compound when the mold compound contacts the flow control dams 110a and/or 110b and prior to the mold compound contacting the one or more bond wires 106. In this manner the force of the flowing mold compound against said bond wires 106 may be reduced, thereby preventing, or at least reducing, the risk of wire sweep occurring as a result of the flowing of the mold compound. In some embodiments, during flowing of the mold compound, at least a portion of the mold compound may flow over and/or about the flow control dams 110a, 110b, such that bond wires 106 are encapsulated by the mold compound. For example, at least a portion of the mold compound may flow over and/or around the one or more flow control dams 110a, 110b, such that the flow control dams 110a, 110b are encapsulated.

The flow control dams 110 may protrude from the top planar surface 103 of the substrate 102 proximate one or more bond wires 106. In some embodiments the flow control dams 110 are positioned proximate bond wires 106 that have a higher risk of wire sweep than other bond wires at different positions on the substrate 102. For example, as shown in FIG. 1, the first and second flow control dams 110a, 110b are positioned proximate two bond wires 106 that are positioned proximate a corner of semiconductor die 104a. Bond wires 106 proximate corners of the semiconductor die 104a may be at a higher risk of wire sweep than bond wires 106 positioned further from the corners of semiconductor die 104a due to an increased flow rate of the mold compound proximate the corners of semiconductor die 104a. The first flow control dam 110a is positioned on a first side of the bond wires 106 and the second flow control dam 110b is positioned on a second side of the bond wires 106, opposite the first side. The first flow control dam 110a may be spaced from the proximal edge 105 of the semiconductor die 104a and may extend along a longitudinal axis $A_1$ that is generally perpendicular to the proximal edge 105. Similarly, the second flow control dam 110b may be spaced from the proximal edge 105 of the semiconductor die 104a and may extend along a longitudinal axis $A_2$ that is generally perpendicular to the proximal edge 105. The flow control dams 110a, 110b may be positioned on the top planar surface 103 of substrate 102 such that the flow control dams 110a, 110b do not directly contact any bond wires 106. In some embodiments, the longitudinal axes $A_1$ and $A_2$ that the first and second flow control dams 110a, 110b extend along may be at an oblique angle relative to the proximal edge 105 of the semiconductor die 104a. In FIG. 1A, only two bond wires 106 are positioned between the flow control dams 110a and 110b, however it will be understood that there may be fewer or greater than two bond wires 106 positioned between the first and second flow control dams 110a and 110b.

The flow control dams 110a, 110b protrude from the top planar surface 103 in a direction that is generally perpendicular to a plane defined by the top planar surface 103. The flow control dams 110a, 110b protrude from the top planar surface 103 of the substrate 102 by a height, as measured in a direction normal to the top planar surface 103, of between about 150 micrometers to about 450 micrometers. Here the term about means+/−10%.

In some embodiments, the flow control dams 110a, 110b have a width as measured along an axis (not shown) extending perpendicular to the longitudinal axes $A_1$ and $A_2$ respectively of between about 10 micrometers to about 50 micrometers, +/−10%.

In some embodiments, the flow control dams 110a and 110b have a length as measured along the respective longitudinal axes $A_1$ and $A_2$ that is about three-fourths of the length of an adjacent bond wire. In some embodiments, the length of the flow control dams 110a and 110b is between about 1100 micrometers and 1800 micrometers. In some embodiments, both the first flow control dam 110a and second flow control dam 110b have generally the same length, height, and/or width. In other embodiments, one of the first flow control dam 110a and second flow control dam 110b have a length, height, and/or width, which is different from the other.

Bond wires 106 may extend past the proximal edge 105 of semiconductor die 104a to substrate 102 by a length as measured along an axis (not shown) generally parallel to longitudinal axes $A_1$ and/or $A_2$. The length of the bond wires 106 may be about the same as the length of one or more of the flow control dams 110a and 110b. In some embodiments, the length of bond wires 106 may be greater than or less than the length of one or more of the flow control dams 110a and 110b. Each of the bond wires 106 may have the same length or they may vary in length, as is understood by those of skill in the art. The one or more bond wires 106 connect to corresponding bond pads 107 that are positioned on the top planar surface 103 of substrate 102 on or proximate an axis B that is generally parallel to and spaced from the proximal edge 105 of semiconductor die 104a. Each control dam 110a and 110b may have a proximal edge 111a and 111b, respectively, that extends beyond axis B. In some embodiments, the proximal edge 111a and 111b of the control dams 110a and 110b are positioned on or proximate axis B. In other embodiments, the proximal edges 111a and 111b of control dams 110a and 110b do not extend past axis B. In FIG. 1, each flow control dam 110a and 110b has a generally rectangular shape, however flow control dams 110a and 110b may be any shape, such as substantially cubic, spherical, cylindrical, conical, or pyramidal. Flow control dams 110a, 110b having a shape different than a generally rectangular shape, as shown in FIG. 1, may still intersect or extend along axes $A_1$ and/or $A_2$ respectively. In some embodiments, the flow control dams 110a and 110b may have one or more surfaces having a non-linear or a curved shape. For example, one or more of the linear lines depicted in FIG. 1 for either of flow control dams 110a or 110b may have a concave or convex curvature. Furthermore, one of the flow control dams 110a and 110b may have a different shape, size, and/or composition than the other flow control dam 110a or 110b.

Figure 2:
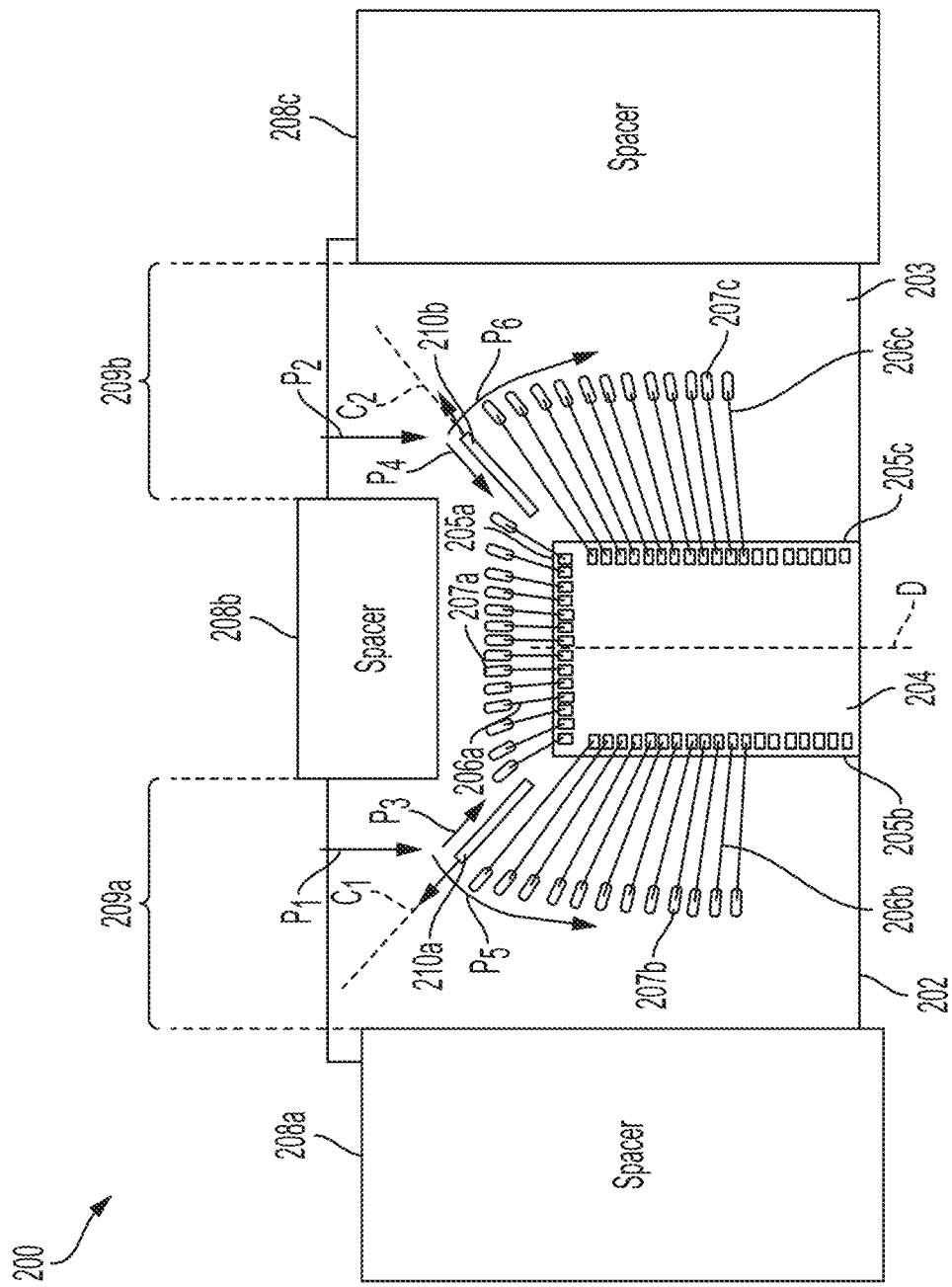
FIG. 2 is a top plan schematic view of a portion of a semiconductor package in accordance with another exemplary embodiment of the present disclosure.

Referring to FIG. 2, there is shown a portion of a semiconductor package, generally designated 200, in accordance with another embodiment of the present disclosure. The semiconductor package 200 may include a substrate 202, and a semiconductor die 204 mounted on the substrate 202. The semiconductor die 204 may be a NAND die, an ASIC die, a control die, or another memory chip for providing a storage amount. In FIG. 2, only a single die 204 is shown, however the semiconductor package 200 may include additional semiconductor dies (e.g., NAND dies or other memory dies). Semiconductor die 204 may be mounted on a top planar surface 203 of substrate 202. The substrate 202 may include one or more electrical connections (e.g., electrical wiring), not shown, disposed within the substrate 202 to allow one or more components to be electrically connected to the substrate 202. In some embodiments, the substrate 202 includes one or more bond pads 207a-207c in electrical communication with the one or more electrical connections. The one or more bond pads 207a-207c may be positioned on the top planar surface 203 of substrate 202 such that the one or more components (e.g., the die 204 as well as passive devices) may be electrically connected to substrate 202 For example, semiconductor die 204 may be electrically connected to substrate 202 by one or more bond wires 206a-206c electrically connected to corresponding bond pads 207a-207c. In this manner, the bond wires 206a-206c are electrically connected to the one or more electrical connections disposed within substrate 202. In some embodiments, the one or more bond wires 206a-206c electrically connecting the semiconductor die 204 to the substrate 202 may be connected to the semiconductor die 204 proximate one or more edges of the semiconductor die 204. In other embodiments, the one or more bond wires 206a-206c are connected to the substrate proximate a single edge of the semiconductor die 204.

In some embodiments, the semiconductor die 204 includes a proximal edge 205a, a distal edge (not shown) opposite the proximal edge 205a, and two side edges 205b, 205c extending between the proximal and distal edges. The one or more bond wires 206 may be electrically connected to the semiconductor die 204 proximal one or more edges 205a-205c of the semiconductor die 204. For example, as shown in FIG. 2, there is a first plurality of bond wires 206a electrically connected to the semiconductor die 204 proximate the proximal edge 205a. There may be a second plurality of bond wires 206b electrically connected to the semiconductor die 204 proximate the first side edge 205b. Although not shown, there may be a plurality of bond wires electrically connected to the distal edge of the semiconductor die 204 similar to how the first plurality of bond wires 206a are electrically connected to the proximal edge 205a. In some embodiments, the first plurality of bond wires 206a may be generally evenly spaced on the semiconductor die 204 proximate the proximal edge 205a. In FIG. 2, the second and third pluralities of bond wires 206b and 206c are shown positioned at locations along a portion of the corresponding side edges 205b and 205c. However, it will be understood that the bond wires 206b and 206c may be positioned at greater or fewer positions along the corresponding side edges 205b and 205c. Bond wires 206a-206c may be comprised of, for example, aluminum, copper, silver, gold, or a combination or alloys thereof.

The semiconductor package 200 may include one or more spacers 208a-208c to provide separation between two or more dies and/or to provide vertical spacing between a semiconductor die (not shown) mounted above semiconductor die 204. Vertical may refer to a direction that is normal to the top planar surface 203 of substrate 202 or, put another way, a direction that is out of the page from what is shown in FIG. 2 and normal to the top planar surface 203. The spacers 208a-208c may be mounted to and protrude from the top planar surface 203 of substrate 202. In some embodiments, the spacers 208a-208c define one or more tunnels that a mold compound (not shown) may be flowed through. For example, spacer 208a and spacer 208b may define a first tunnel 209a that at least a portion of a mold compound may be flowed through. Similarly, spacer 208b and spacer 208c may define a second tunnel 209b that at least a portion of said mold compound may be flowed through. The mold compound may include, for example, ceramic, glass, thermoplastic materials, thermoset resins, or composites thereof. In some embodiments, the mold compound may be an epoxy mold compound (EMC) that includes a mixture of epoxy resins and one or more additives (e.g., curing agents, hardeners, accelerators, fillers, flame retardants, adhesion promoters, and/or pigments).

The mold compound may be provided in a flowable state such that the mold compound is in a liquid or semi-liquid state to allow the liquid mold to be flowed through tunnels 209a and 209b, over the substrate 202, the semiconductor die 204, and/or bond wires 206a-206c. In some embodiments, the tunnels 209a and 209b each have a corresponding length as measured in a direction generally perpendicular to a proximal edge of the substrate 202. In conventional semiconductor packaging that includes spacer and tunnel structures, the length of the tunnels may impact the risk of wire sweep occurring. For example, as tunnel length increases and/or the viscosity of the mold compound that is flowed through said tunnels increases, the risk of wire sweep occurring may increase as well. Therefore, the semiconductor package 200 may include one or more flow control dams 210 configured to reduce the occurrence of wire sweep of the bond wires 206. For example, the semiconductor package 200 may include a first flow control dam 210a and a second flow control dam 210b. The first flow control dam 210a and second flow control dam 210b may protrude from the top planar surface 203 of substrate 202. In some embodiments, the flow control dams 210a and 210b are integrally formed with the top planar surface 203 of substrate 202. For example, the more flow control dams 210a and 210b may be formed with the substrate 202 such that there are no seams or separation between the top planar surface 203 of substrate 202 and where the flow control dams 210a and 210b protrude from said top planar surface 103. Put another way, the flow control dams 210a and 210b and substrate 202 are a unitary construct or that the flow control dams 210a and 210b and substrate 202 are formed into a single piece or unit.

The liquid mold compound may be flowed through tunnels 209a and 209b, along one or more flow paths, which are illustrated by the arrows extending towards, generally parallel to, and away from flow control dams 210a and 210b respectively. In some embodiments, the liquid mold compound is flowed along the flow paths such that the liquid mold compound flows over and encapsulates semiconductor die 204, the bond wires 206a-206c, and the portions of substrate 202 not covered by the semiconductor die 204. The liquid mold compound may be cured or hardened such that the liquid mold compound solidifies to protect substrate 202, semiconductor die 204, and/or bond wires 206a-206c. In some embodiments, the flow paths are defined by the one or more flow control dams 210a and 210b respectively. The liquid mold compound, when flowed over the substrate 202, may contact the one or more flow control dams 210a and 210b. In some embodiments, the one or more flow control dams 210a and 210b are configured to prevent wire sweep of the one or more bond wires 206 from occurring during flowing of the mold compound. For example, the one or more flow control dams 210a and/or 210b may deflect at least a portion of the mold compound away from one or more bond wires 106, thereby at least reducing the risk of wire sweep occurring. In some embodiments, the flow rate of the portions of the liquid mold compound that contacts and/or is deflected by the one or more flow control dams 210a and/or 210b may be decreased to reduce the risk of wire sweep from occurring. In some embodiments, during flowing of the liquid mold compound, at least a portion of the liquid mold compound may flow over and/or about the flow control dams 210a and/or 210b, such that bond wires 206a-206c are encapsulated by the mold compound.

The flow control dams 210a and 210b protrude from the top planar surface 203 of substrate 202 at positions proximate the one or more bond wires 206a-206c. In some embodiments, the flow control dams 210a and 210b are positioned proximate bond wires 206a-206c, respectively, that have a higher risk of wire sweep than other bond wires at different positions on substrate 202. For example, as shown in FIG. 2, flow control dam 210a is positioned between the first plurality of bond wires 206a and the second plurality of bond wires 206b where the bond wires are proximate a corner of semiconductor die 204. A corner of the semiconductor die 204 may refer to the location where the proximal edge 205a contacts one of side edges 205b and/or 205c. Similarly, a corner may refer to a location where the distal edge (not shown) of the semiconductor die 204 contacts one of side edges 205b and/or 205c. Flow control dam 210a may be positioned proximate the corner of semiconductor die 204 where the proximal edge 205a contacts the first side edge 205b. The flow control dam 210a may be spaced from said corner such that the flow control dam 210a does not directly contact semiconductor die 204. The flow control dam 210a may extend along a first axis $C_1$ that is at an oblique angle relative to the proximal edge 205a of semiconductor die 204.

By positioning the flow control dam 210a on substrate 202 such that it extends along first axis $C_1$, a portion of the liquid mold compound flowing along the flow paths $P_1$ and $P_2$, indicated by the arrows pointing toward the flow control dams 210a and 210b respectively, that contacts flow control dam 210a may be deflected and/or the flow rate of the liquid mold compound may be reduced. In some embodiments, a portion of the liquid mold compound is deflected by flow control dam 210a such that said portion flows generally along the flow paths $P_3$ and $P_4$ indicated by the arrows generally parallel to flow control dam 210a and pointing towards proximal edge 205a of semiconductor die 204. The portion of the liquid mold compound may at least partially encapsulate the first plurality of semiconductor dies 206a without causing, or at least reducing, the occurrence of wire sweep of one or more bond wires included in the first plurality of bond wires 206a. In some embodiments, another portion of the liquid mold compound is deflected by the flow control dam 210a such that said other portion flows generally along the flow paths $P_5$ and $P_6$ indicated by the arrows that curves partially around and points away from flow control dam 210a. The other portion of the liquid mold compound may at least partially encapsulate the second plurality of bond wires 206b without causing, or at least reducing, the occurrence of wire sweep of one or more bond wires included in the second plurality of bond wires 206b. In this manner, the flow control dam 210a may prevent, or reduce the risk of, wire sweep occurring in bond wires 206a and/or bond wires 206b by deflecting portions of the liquid mold compound such that the liquid mold compound flows along the above-mentioned flow paths.

Flow control dam 210b may be positioned proximate a corner of semiconductor die 204 where the proximal edge 205a contacts the second side edge 205c. The flow control dam 210b may be spaced from said corner such that the flow control dam 210b does not directly contact semiconductor die 204. In some embodiments, flow control dams 210a and 210b may be symmetrically arranged about semiconductor die 204. For example, as shown in FIG. 2, the flow control dams 210a and 210b are symmetrical about a central axis D extending perpendicular to the proximal edge 205a and generally evenly spaced between side edges 206b and 205c. The flow control dam 210b may extend along a second axis $C_2$ that is at an oblique angle relative to the proximal edge 205a of semiconductor die 204. Similar to flow control dam 210a, by positioning flow control dam 210b on substrate 202 such that it extends along second axis $C_2$, a portion of the liquid mold compound that contacts flow control dam 210b may be deflected and/or the flow rate of the liquid mold compound may be reduced. In some embodiments, a portion of the liquid mold compound is deflected by flow control dam 210b such that said portion flows generally along the flow path indicated by the arrow generally parallel to flow control dam 210b and pointing towards proximal edge 205a of semiconductor die 204. Said portion of the liquid mold compound may at least partially encapsulate the first plurality of semiconductor dies 206a without causing, or at least reducing, the occurrence of wire sweep. In some embodiments, the portions of the liquid mold compound deflected by flow control dams 210a and 210b, in combination with one another, encapsulate substantially all of the first plurality of bond wires 206a.

In some embodiments, another portion of the liquid mold compound is deflected by the flow control dam 210b such that said other portion flows generally along the flow path indicated by the arrow that curves partially around and points away from flow control dam 210b. Said other portion of the liquid mold compound may at least partially encapsulate the third plurality of bond wires 206c without causing, or at least reducing, the occurrence of wire sweep of one or more bond wires included in the third plurality of bond wires 206b. In this manner, the flow control dam 210b may prevent, or reduce the risk of, wire sweep occurring in bond wires 206a and/or bond wires 206c by deflecting portions of the liquid mold compound such that the liquid mold compound flows along the above-mentioned flow paths. In some embodiments, flow control dam 210a and/or flow control dam 210b are positioned on the substrate 202 such that the liquid mold compound contacts the flow control dams 210a, 210b before contacting one or more of bond wires 206a-206c. For example, each of the flow control dams 210a and 210b are positioned ahead of bond wires 206a-206c in a proximal direction such that the liquid mold flowing along the flow path indicated by the arrows directed toward the flow control dams 210a and 210b, respectively, contacts and is deflected by said flow control dams 210a and 210b before the liquid mold compound contacts any one of bond wires 206a-206c.

In some embodiments, flow control dams 210a and/or 210b protrude from the top planar surface 203 of the substrate 202 in a direction that is generally perpendicular to a plane defined by the top planar surface 203. In some embodiments, the flow control dams 210a, 210b protrude from the top planar surface 203 of the substrate 202 by a height, as measured in a direction normal to the top planar surface 203, of about 55-85 micrometers. The height of the flow control dams 210a and 210b may be measured as a percentage of the height of spacers 208a-208c. For example, the height of flow control dams 210a, 210b may be between about 45%-75% the height of spacers 208a-208c.

In some embodiments, the flow control dams 210a, 210b have a width as measured along an axis (not shown) extending perpendicular to the axes $C_1$ and $C_2$ respectively of between about 10-45 micrometers. In some embodiments, the flow control dams 210a and 210b have a length as measured along the respective axes $C_1$ and $C_2$ of between about 750-1500 micrometers.

In some embodiments, the length of the flow control dams 210a, 210b may be a percentage of the length of one or more bond wires located proximate the corners of semiconductor die 204. For example, the length of the control dams 210a and 210b may be a percentage of the length of the adjacent bond wires included in the second and third pluralities of bond wires 206b and 206c, respectively. The length of the bond wires included in the second and third pluralities of bond wires 206b, 206c may be measured as the distance from where the bond wires connect to the semiconductor die to where the bond wires connect to substrate 202. In some embodiments, the length of the flow control dams 210a and 210b are between about 50-90% of the length of the adjacent bond wires included in the second and third pluralities 206b and 206c. In some embodiments, both the first flow control dam 210a and second flow control dam 210b have generally the same length, height, and/or width. In other embodiments, one of the first flow control dam 210a and second flow control dam 210b have a length, height, and/or width, which is different from the other. In FIG. 2, each flow control dam 210a and 210b has a generally rectangular shape, however flow control dams 210a and 210b may be any shape, such as substantially cubic, spherical, cylindrical, conical, or pyramidal. Furthermore, one of the flow control dams 210a and 210b may have a different shape, size, and/or composition than the other flow control dam 210a or 210b.

Figure 3A:
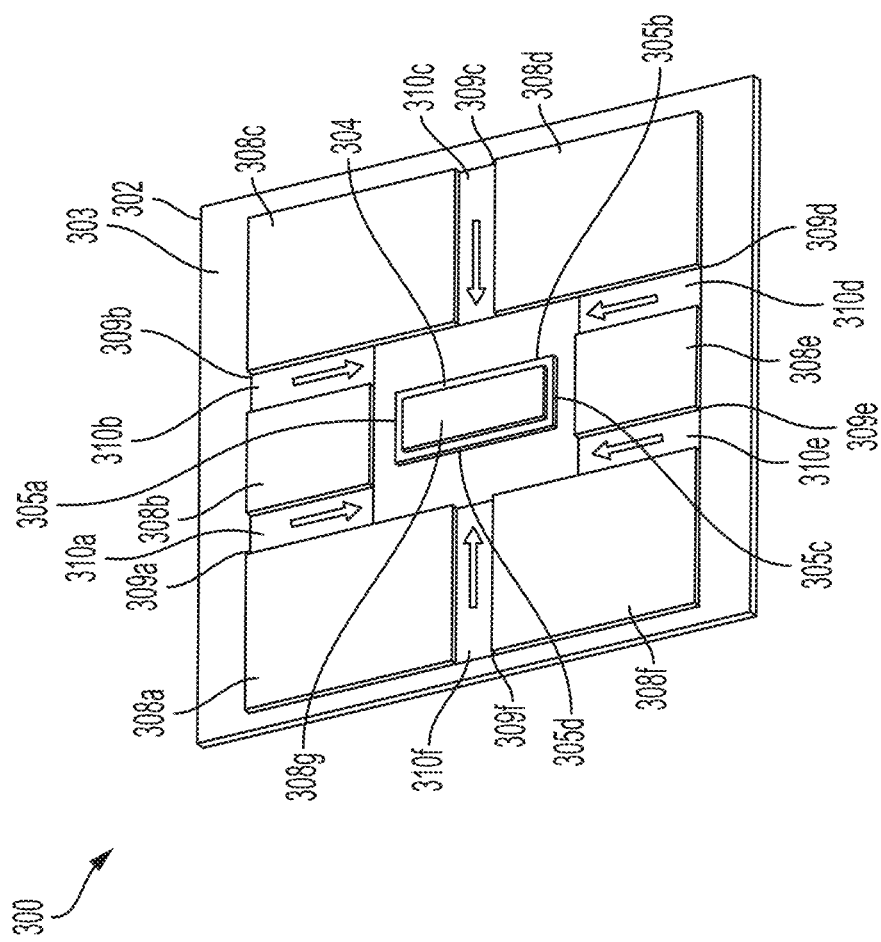
FIG. 3A is a top perspective schematic view of a portion of a semiconductor package in accordance with another exemplary embodiment of the present disclosure.
Figure 3B:
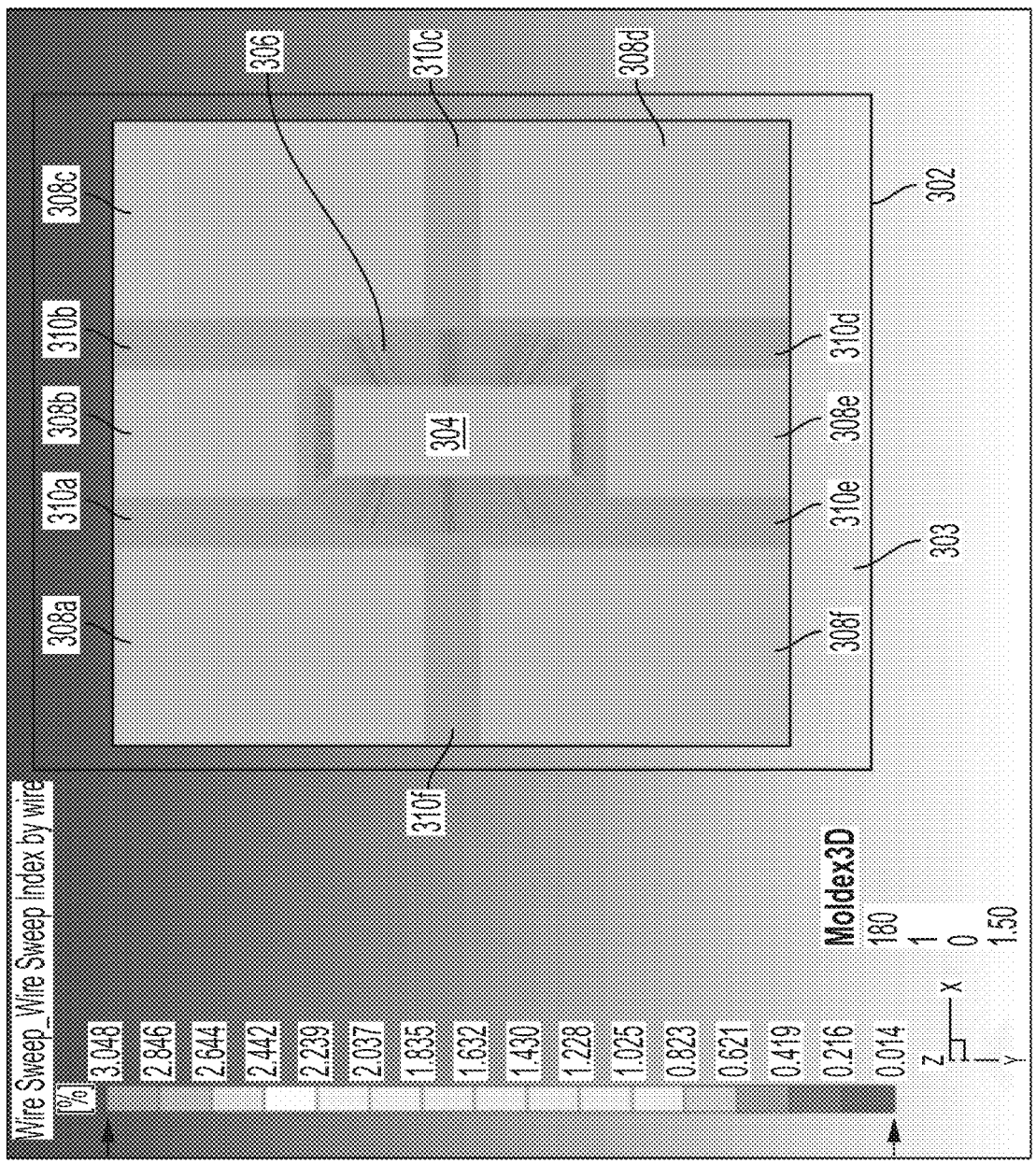
FIG. 3B is a chart illustrating the results of a mold flow and wire sweep simulation performed on the semiconductor package of FIG. 3A.

Referring to FIGS. 3A-3B, there is shown a semiconductor package, generally designated 300, in accordance with another embodiment of the present disclosure. The semiconductor package 300 includes a substrate 302, and a semiconductor die 304 mounted on the substrate 202. The semiconductor die 304 may be a NAND die, an ASIC die, a control die, or another memory chip for providing a storage amount. In FIG. 3, only a single die 304 is shown, for clarity, however the semiconductor package 300 may include more than one semiconductor die. Semiconductor die 304 is mounted on a top planar surface 303 of substrate 302. The substrate 302 may include one or more electrical connections (e.g., electrical wiring), not shown, disposed within the substrate 302 to allow one or more components to be electrically connected to the substrate 302. For example, semiconductor die 304 may be electrically connected to substrate 302 by one or more bond wires 306 (shown in FIG. 3B). The one or more bond wires 306 may be electrically connected to the semiconductor die 304 and to the one or more electrical connections disposed within substrate 302.

In some embodiments, the semiconductor package 300 includes one or more spacers 308 to provide separation between two or more dies and/or to provide vertical spacing between a semiconductor die (not shown) mounted above semiconductor die 304. Vertical may refer to a direction that is normal to the top planar surface 303 of substrate 302 or, put another way, a direction that is out of the page from what is shown in FIGS. 3A-3B and normal to the top planar surface 203. In some embodiments, the semiconductor package may include six spacers 308a-308f mounted on the top planar surface 303 of substrate 302 and a spacer 308g mounted on semiconductor die 304. Spacers 308a-308f and the top planar surface 303 of substrate 302 may define one or more tunnels 309 that a mold compound (not shown) may be flowed through such that the mold compound may encapsulate the semiconductor die 304 and bond wires 306. For example, the first spacer 308a and second spacer 308b may define a first tunnel 309a that a portion of the mold compound may be flowed through. The second spacer 308b and third spacer 308c may define a second tunnel 309b that a portion of the mold compound may be flowed through. Similarly, the third spacer 308c and fourth spacer 308d may define a third tunnel 309c, the fourth spacer 308d and fifth spacer 308e may define a fourth tunnel 309d, the fifth spacer 308e and sixth spacer 308f may define a fifth tunnel 309e, and the sixth spacer 308f and first spacer 308a may define a sixth tunnel 309f. In some embodiments, each of tunnels 309a-309f may have generally the same size (e.g., length, width, and height). In other embodiments, one or more of tunnels 309a-309f may have a size that is different than another of the one or more tunnels 309a-309f. In some embodiments, one or more of the tunnels 309a-309f may be oriented differently than another of the one or more tunnels 309a-309f with respect to substrate 302. For example, the first tunnel 309a is oriented in a first direction and the sixth tunnel 309f is oriented in a second direction that is rotated about 90 degrees from the first direction.

The semiconductor die 304 may include a proximal edge 305a, a distal edge 305c opposite the proximal edge 305a, and a first longitudinal edge 305b and a second longitudinal edge 305d extending between the proximal and distal edges 305a, 305c. The one or more bond wires 306 may be electrically connected to the semiconductor die 304 proximate edges 305a-305d. The one or more bond wires 306 may be generally evenly spaced along each edge 305a-305d of the semiconductor die 304. The bond wires 306 may be comprised of, for example, aluminum, copper, silver, gold, or a combination or alloys thereof. The semiconductor die 304 may be positioned on the top planar surface 303 of the substrate 302 such that the semiconductor die 304 does not contact any of spacers 308a-308f. In some embodiments, the semiconductor die 304 is positioned generally evenly between spacers 308a-308f that are opposite one another. For example, semiconductor die 304 is positioned between spacer 308b and spacer 308e such that the distance between the proximal edge 305a, as measured in a direction normal to the proximal edge 305a, to spacer 308b is generally equal to the distance between the distal edge 305c, as measured in a direction normal to the distal edge 305c, to spacer 308e. Similarly, the semiconductor die 304 may be positioned evenly between spacers 308a and 308c and spacers 308f and 308d as measured in a direction normal to the corresponding longitudinal edges 305b and 305d.

In some embodiments, each tunnel 309a-309f is oriented generally perpendicular to one or more edges 305a-305d of the semiconductor die 304. For example, the first and second tunnels 309a and 309b are oriented generally perpendicular to the proximal edge 305a of semiconductor die 304. The third tunnel 309c may be oriented generally perpendicular to the first longitudinal edge 305b. The fourth and fifth tunnels 309d and 309e may be oriented generally perpendicular to the distal edge 305c. The sixth tunnel 309f may be oriented generally perpendicular to the second longitudinal edge 305d. As discussed above, a mold compound may be provided such that the mold compound encapsulates the semiconductor die 304 and the one or more bond wires 306. The mold compound may be provided in a flowable state such that the mold compound is in a liquid or semi-liquid state to allow the liquid mold to be flowed through tunnels 309a-309f, over the substrate 302, the semiconductor die 304, and/or bond wires 306. In some embodiments, the mold compound flows in a direction that is defined by the orientation of the corresponding tunnel 309a-309f that the mold compound flows through. For example, the liquid mold compound may flow generally along the directions indicated by the arrows in FIG. 3A through the corresponding tunnels 309a-309f towards the semiconductor die 304. The mold compound may include, for example, ceramic, glass, thermoplastic materials, thermoset resins, or composites thereof. In some embodiments, the mold compound may be an epoxy mold compound (EMC) that includes a mixture of epoxy resins and one or more additives (e.g., curing agents, hardeners, accelerators, fillers, flame retardants, adhesion promoters, and/or pigments).

In some embodiments, one or more flow control dams 310 are positioned in at least one of the tunnels 309a-309f to reduce the prevent, or at least reduce, the occurrence of wire sweep of bond wires 306 due to flowing of the mold compound. In some embodiments, there is a flow control dam 310a-310f positioned in each tunnel 309a-309f. In other embodiments, a flow control dam 310 may not be positioned in one or more of tunnels 309a-309f. The flow control dams 310a-310f protrude from the top planar surface 303 of substrate 302 by a height that is less than or equal to a height of the adjacent spacers 308a-308f. In some embodiments, the flow control dams 310a-310f have a height that is between about 25-75% of the height of the corresponding adjacent spacers 308a-308f. In some embodiments, the height of the flow control dams 310a-310f may be between about 10-15 micrometers. In some embodiments, each flow control dam 310a-310f may have a length and width that are generally equal to the length and width of the corresponding tunnel 309a-309f that the flow control dam 310a-310f is positioned in. In other embodiments, one or more of flow control dams 310a-310f may have a length and/or width that is less than the length and/or width of the corresponding tunnel 309a-309f that the flow control dam 310a-310f is positioned in. The flow control dams 310a-310f are integrally formed with the top planar surface 303 of substrate 302. For example, the flow control dams 310a-310f may be formed with the substrate 302 such that there are no seams or separation between the top planar surface 303 of substrate 302 and where the flow control dams 310a-310f protrude from the top planar surface 303. Put another way, the flow control dams 310a-310f and substrate 302 are a unitary construct, or the flow control dams 310a-310f and substrate 302 are formed into a single piece or unit.

In some embodiments, the flow control dams 310a-310f are configured to reduce the flow rate of liquid mold compound flowing through tunnels 309a-309f thereby preventing, or at least reducing the occurrence of wire sweep of bond wires 306. For example, the liquid mold compound may have a first flow rate corresponding to the flow of the liquid mold compound before it enters into any one of tunnels 309a-309f. As the liquid mold compound enters the tunnels 309a-309f, the corresponding flow control dams 310a-310f may cause the flow rate of the liquid mold compound to be reduced from the first flow rate to a second flow rate that is lower than first flow rate. The liquid mold compound may flow, generally along the flow paths shown in FIG. 3A, towards semiconductor die 304 and bond wires 306 at a flow rate that is less than or equal to the second flow rate. In this manner, the flow rate of the liquid mold compound may be reduced as the liquid mold compound is flowed towards the semiconductor die 304 and bond wires 306 thereby preventing, or at least reducing, the risk of wire sweep from occurring in bond wires 306 due to the flow of the liquid mold compound.

For example, FIG. 3B depicts a simulation test of the semiconductor package 300 where a liquid mold compound is flowed through tunnels 309a-309f that each include the corresponding flow control dam 310a-310f having a length and width generally the same size as the tunnels 309a-309f and having a height of about 10 micrometers. A similar test was also conducted in a semiconductor package that is generally the same as the semiconductor package 300, except that no flow control dams 310a-310f were included in the tunnels 309a-309f. As a result of the simulation testing of both semiconductor package 300 and the semiconductor package devoid of flow control dams 310a-310f, it was found that the occurrence of wire sweep was reduced by about 5.6% in the semiconductor package 300 as compared to the semiconductor package devoid of flow control dams 310a-310f. In FIG. 3B, the color index indicates the percentage of bond wires where wire sweep has occurred. The red color indicates a higher percentage of wire sweep than the blue color.

Figure 4A:
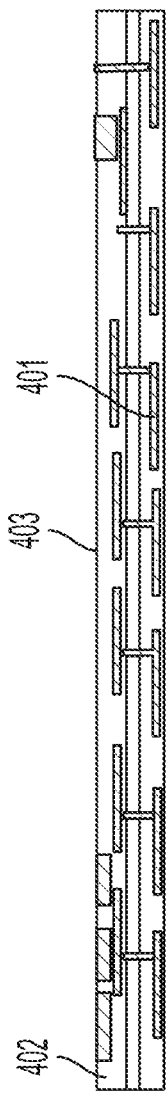
FIGS. 4A-4E are cross-sectional side views illustrating the steps for forming a substrate having integrally formed flow control dams for a semiconductor package in accordance with an embodiment of the present disclosure.
Figure 4B:
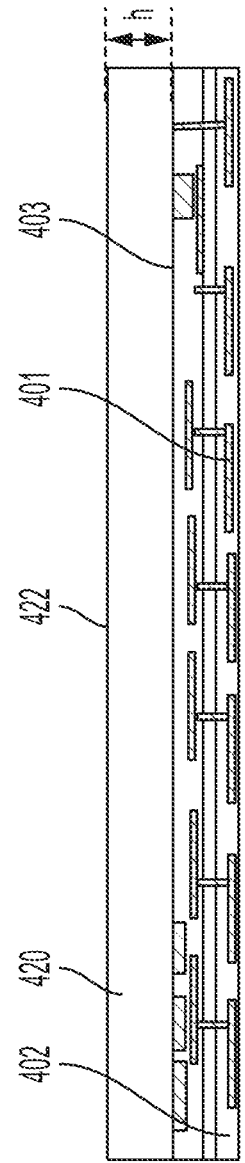

Referring to FIG. 4A-4E, there is shown cross-sectional side views illustrating the steps for forming a substrate having integral flow control dams for use in a semiconductor package, generally designated 400 (see FIG. 4E), in accordance with an embodiment of the present disclosure. Referring to FIG. 4A, a substrate 402 having a top planar surface 403, and one or more electrical connections 401 (e.g., signal traces) disposed within the substrate 402 may be provided. Substrate 402 may be used for substrates 102, 202, and/or 302 shown in FIGS. 1-3B. Referring to FIG. 4B, a solder mask layer 420 is disposed on the top planar surface 403 of substrate 402. In some embodiments, the solder mask layer 420 is pre-formed and mounted or laminated on the top planar surface 403. However, it will be understood by those of skill in the art that the solder mask layer 420 may be formed or disposed on the surface 403 in any other manner. The solder mask layer 420 may have a top planar surface 422 that is disposed opposite the top planar surface 403 of substrate 402. The solder mask layer 420 may have a height h as measured in a direction perpendicular to the top planar 403 of substrate 402 and the top planar surface 422 of solder mask layer 420. The height h of the solder mask layer 420 may define the height of one or more flow control dams (e.g., flow control dams 410 shown in FIG. 4E) to be formed from the solder mask layer 420. In some embodiments, the solder mask layer 420 is integrally formed with the top planar surface 403 of substrate 402. In some embodiments, the solder mask layer 420 is laminated onto the top planar surface 403 of substrate 402 such that the substrate 402 and solder mask layer 420 are integrally formed. For example, the solder mask layer 420 may be formed with the substrate 402 such that there are no seams or separation between the top planar surface 403 of substrate 402 and where the solder mask layer 420 protrudes from said top planar surface 403. Put another way, the solder mask layer 420 and substrate 402 may be a unitary construct, or that the solder mask layer 420 and substrate 402 are formed into a single piece or unit.

Figure 4C:
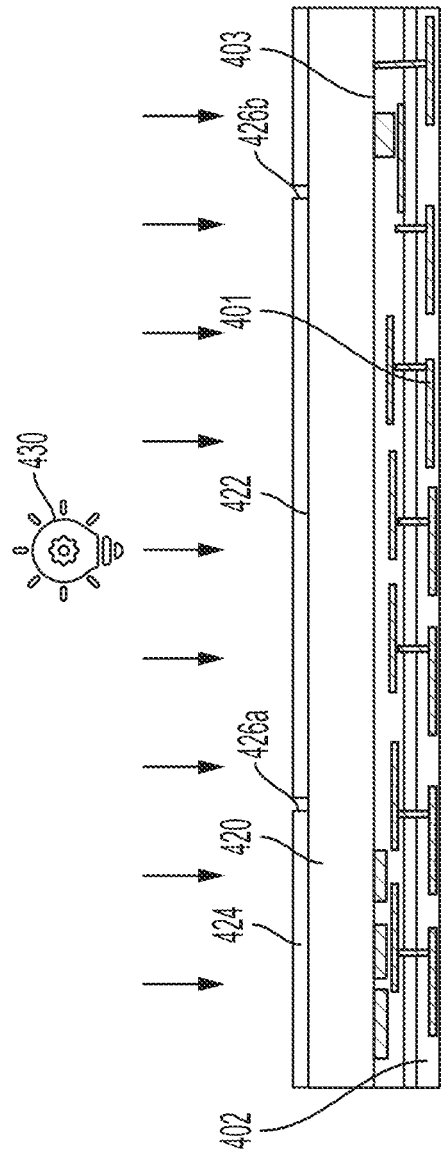

Referring to FIG. 4C, one or more removable masks 424 may be mounted on the top planar surface 422 of the solder mask layer 420. The removable masks 424 may be configured to be removed from the top planar surface 422 of the solder mask layer 420. The removeable mask 424 may define one or more apertures 426 positioned above portions of the solder mask layer 420 where one or more flow control dams may be integrally formed therefrom. The one or more apertures 426 may define the position, orientation, and/or shape of one or more flow control dams (e.g., flow control dams 410 shown in FIG. 4E) to be formed from the solder mask layer 420. In FIG. 4C, the removable mask 424 defines two apertures 426a and 426b, however it will be understood that the removeable mask 424 may define fewer than two apertures or more than two apertures. In some embodiments, the size and shape of apertures 426 will define the size and shape of the footprint of the flow control dams on top planar surface 403.

As mentioned above, the one or more apertures 426 may define the one or more flow control dams 410 to be formed from the solder mask layer 420. In some embodiments, the one or more flow control dams 410 may be formed through a process of curing portions of the solder mask layer 420 and exposing the solder mask layer 420 to an etching process (FIG. 4D) in which the portions of the solder mask layer 420 that are uncured are removed while the portions that are cured are not removed. In some embodiments, the solder mask 420 may be a comprised of an ultraviolet (UV) light sensitive material such that the solder mask 420 cures when exposed to UV light. In FIG. 4C, the curing process is shown in which a UV light source 430 is used to cure portions of the solder mask layer 420 disposed below the apertures 426a and 426b. The UV light source 430 may emit UV light such that portions of the solder mask layer 420 that are not covered by the removeable mask 424 (e.g., the portions of the solder mask layer 420 below apertures 426a and 426b) are exposed to said UV light. In some embodiments, the removeable mask 424 may be comprised of a metal or metal alloy, or other material that is opaque to UV light, and configured to prevent the portions of the solder mask layer 420 covered by the removeable mask 424 from being exposed to the UV light emitted by the UV light source 430. In this manner, one or more areas of the solder mask layer 420 may be cured and one or more other layers of the solder mask layer 420 may not be cured after the removeable mask 424 is mounted on the top planar surface 422 of the solder mask layer 420. For example, the areas of the solder mask layer 420 that are covered by the removeable mask 424 may not cure and the areas of the solder mask layer 420 that are below the apertures 426a and 426b may be cured before the removeable mask 424 is removed.

Figure 4D:
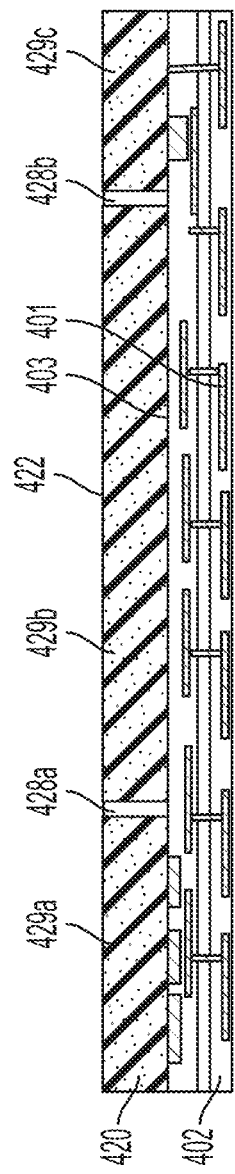

Referring to FIG. 4D, the curing process shown in FIG. 4C is complete and the removeable mask 424 may be removed from the solder mask layer 420. The solder mask layer 420 may include one or more cured portions 428a and 428b and one or more uncured portions 429a-429c corresponding to the removeable mask 424 shown in FIG. 4C. For example, the uncured portions 429a-429c may correspond to the portions of the solder mask layer 420 that were covered by the removeable mask 424, prior to its removal, and the cured portions 428a-428b may correspond to the areas disposed below the apertures 426a-426b of the removeable mask 424, prior to its removal. In some embodiments, the cured portions 428a-428b and uncured portions 429a-429c of the solder mask layer 420 may be exposed to an etching process (e.g., chemical etching, laser etching, plasma etching) such that, the uncured portions 429a-429c of the solder mask layer 420 are removed from the top planar surface 403 of substrate 402. In other embodiments, the uncured portions 429a-429c of the solder mask layer 420 may be removed by other conventional methods known to those skilled in the art.

In some embodiments, by etching, or removing, the uncured portions 429a-429c of the solder mask layer 420, one or more flow control dams 410 may be formed on substrate 402. For example, two flow control dams 410a and 410b are formed on substrate 402 from the cured portions 428a and 428b. In some embodiments, the one or more flow control dams 410 are integrally formed with the substrate 402 and protrude from the top planar surface 403 of the substrate 402. It will be understood that the assembly of semiconductor package 400 as shown in FIGS. 4A-4E may be used to assembly any of the semiconductor packages 100, 200, and/or 300 as shown in FIGS. 1-3A. For example, the removeable mask 424 may define apertures 426 that correspond to the position and orientation of the flow control dams 110, 210, or 310 shown in FIGS. 1-3B. The solder mask layer 420 may be cured, similar as shown in FIG. 4C, and etched, similar to what is shown in FIG. 4D, such that flow control dams 110, 210, or 310, as shown in FIGS. 1-3B respectively, are formed. In some embodiments, one or more semiconductor dies, similar to any one of semiconductor dies 104, 204, or 304, may be mounted on the top planar surface 403 of substrate 402. Furthermore, bond wires similar to bond wires 106, 206, or 306 may be electrically connected to the substrate 402 and corresponding semiconductor die(s). One or more spacers similar to spacers 208 or 308 shown in FIGS. 2-3B may be mounted on the top planar surface 403 of substrate 402.

Figure 4E:
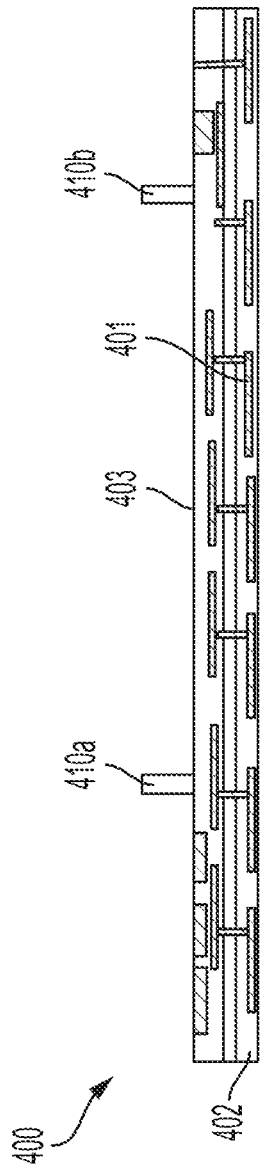
Figure 5:
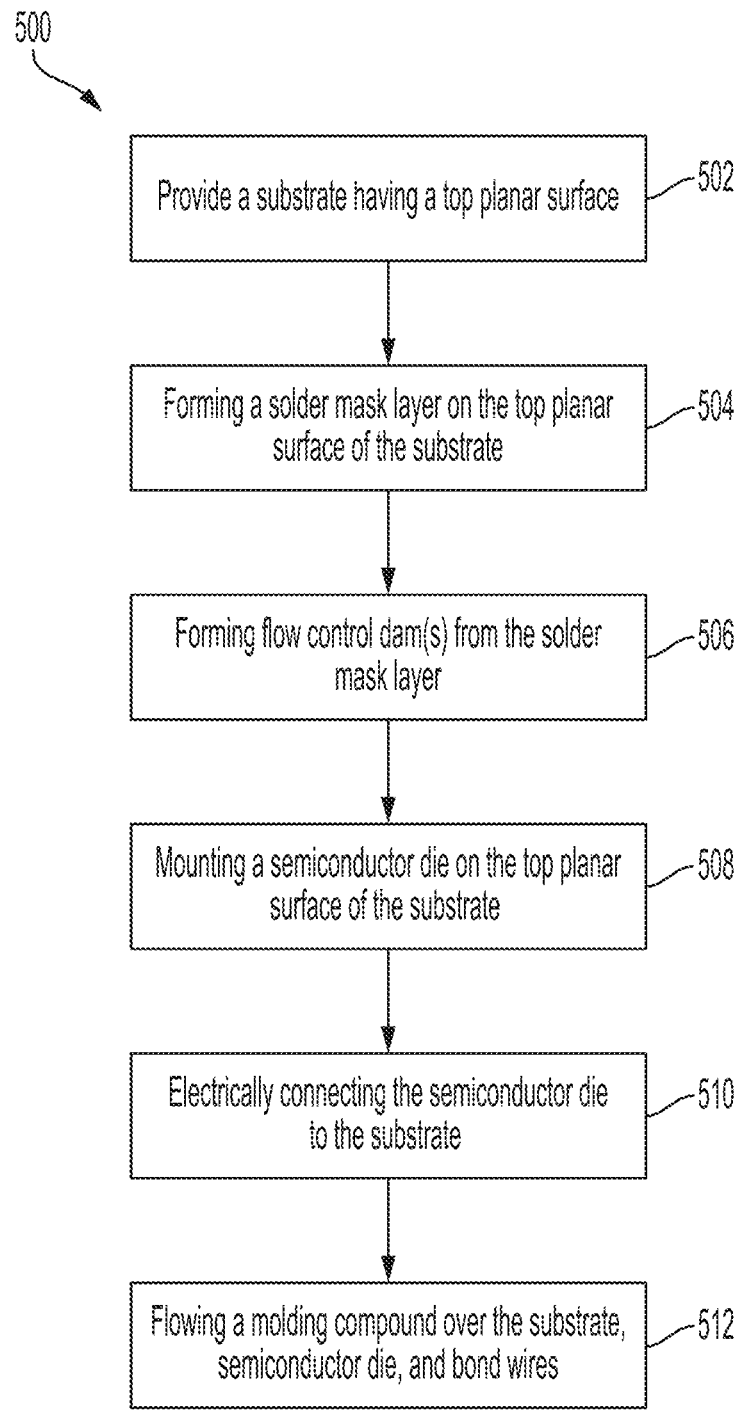
FIG. 5 is an exemplary flowchart illustrating a method of assembling a semiconductor package having mold flow control dams integrally formed therein in accordance with an exemplary embodiment of the present disclosure.

Referring to FIG. 5, there is shown a flow chart outlining steps of a method, generally designated 500, of forming a semiconductor package, in accordance with an exemplary embodiment of the present disclosure. In some embodiments, the method 500 may include the step 502 of providing a substrate having a top planar surface. For example, substrate 402 having a top planar surface 403, is provided. In some embodiments, the substrate provided may be any one of the substrates shown in FIGS. 1-4E. The method 500 may include the step 504 of mounting a solder mask layer on the top planar surface of the substrate. For example, solder mask layer 420 is mounted on the top planar surface 403 of substrate 402 as shown in FIG. 4B. In some embodiments, the solder mask layer is laminated on the top planar surface of the substrate such that the solder mask layer and substrate are integrally formed. The method 500 may include the step 506 of forming flow control dam(s) from the solder mask layer. For example, as shown in FIGS. 4C, a removeable mask 424 defining one or more apertures 426 is mounted on the top planar surface 422 of the solder mask layer 420 and portions of the solder mask layer 420 are cured and the remaining portions of the solder mask layer are not cured. The removeable mask 424 may be removed, as shown in FIG. 4D, from the solder mask layer 420 following the curing process in FIG. 4C and the uncured portions 429a-429c of the solder mask layer 420 are removed, such that one or more flow control dams 410 are formed from the cured portions 428a-428b, as shown in FIG. 4E. In some embodiments, the flow control dams are integrally formed with the top planar surface of the substrate. For example, as shown in any one of FIGS. 1-3B and 4E, the corresponding flow control dams 110, 210, 310, and 410 are integrally formed with the top planar surface 103, 203, 303, 403 of the corresponding substrates 102, 202, 302, and 402.

In some embodiments, the method 500 may include the step 508 of mounting at least one semiconductor die on the top planar surface of the substrate. For example, as shown in FIGS. 1-3B, a corresponding semiconductor die 104, 204, or 304 is mounted on the top planar surface 103, 203, or 303, of the corresponding substrates 102, 202, or 303. In some embodiments, the at least one semiconductor die is positioned such that the at least one semiconductor die does not directly contact the one or more flow control dams. For example, as shown in FIGS. 1-3B, the semiconductor dies 104, 204, and/or 304 do not directly contact the corresponding flow control dams 110, 210, or 310. In some embodiments, the method 500 may include the step 510 of electrically connecting (e.g., wire bonding) the at least one semiconductor die and the substrate with one or more bond wires. For example, the semiconductor dies 104, 204, and/or 304 shown in FIGS. 1-3B, are electrically connected to the corresponding substrates 102, 202, and 302 by one or more bond wires 106, 206, and 306. In some embodiments, the method 500 includes the step 512 of providing a mold compound to encapsulate the at least one semiconductor die and the one or more bond wires. For example, any one of the semiconductor dies 104, 204, and 304 and the corresponding bond wires 106, 206, and 306 shown in FIGS. 1-3B may be encapsulated by a mold compound as discussed above.

In some embodiments, the method 500 includes the step of flowing the mold compound along a flow path defined by the one or more flow control dams such that the mold compound contacts the one or more flow control dams. For example, as discussed above with reference to FIGS. 1-3B, the flow control dams 110, 210, and/or 310 may define flow paths that the mold compound flows along. In some embodiments, at least a portion of the mold compound may be deflected away from the one or more bond wires by the one or more flow control dams. In some embodiments, the one or more flow control dams are configured to prevent wire sweep of the one or more bond wires from occurring during flowing of the mold compound. For example, as discussed above with reference to FIGS. 1-3B, the flow control dams 110, 210, and/or 310 may deflect the mold compound away from the corresponding bond wires 106, 206, and/or 306 thereby preventing, or at least reducing the occurrence of wire sweep of said bond wires 106, 206, and/or 306. In some embodiments, the flow control dams 110, 210, and/or 310 are configured to reduce the flow rate of the mold compound that is flowed over the corresponding semiconductor dies 104, 204, 304 and bond wires 106, 206, 306. The liquid mold compound may subsequently be cured or hardened such that the liquid mold compound solidifies to protect the substrate, semiconductor die, and/or bond wires.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor package, comprising:
   a substrate having a top planar surface;
   a semiconductor die mounted on the top planar surface and electrically connected to the substrate by one or more bond wires;
   one or more flow control dams integrally formed with the top planar surface of the substrate, each of the one or more flow control dams protruding from the top planar surface at a location proximate to the one or more bond wires; and
   two spacers offset from one another and having parallel side surfaces defining a tunnel configured to direct flow of at least a portion of a molding compound toward the one or more flow control dams,
   wherein the one or more flow control dams have a height that is less than a height of the two spacers.

2. The semiconductor package of claim 1, wherein the one or more flow control dams are formed from a solder mask integrally formed with the top planar surface of the substrate.

3. The semiconductor package of claim 1, further comprising:
   a mold compound encapsulating the semiconductor die and the one or more bond wires, and
   wherein the one or more flow control dams are configured to reduce the occurrence of wire sweep of the one or more bond wires.

4. The semiconductor package of claim 3, wherein the one or more flow control dams includes a first flow control dam positioned on a first side of the one or more bond wires and a second flow control dam positioned on a second side of the one or more bond wires opposite the first side.

5. The semiconductor package of claim 4, wherein the first flow control dam and the second flow control dam each extend along respective longitudinal axes that are generally perpendicular to a proximal edge of the semiconductor die.

6. The semiconductor package of claim 1, wherein the one or more flow control dams are positioned proximate a corner of the semiconductor die.

7. The semiconductor package of claim 1, wherein the one or more flow control dams each extend along a respective axis that is at an oblique angle relative to a proximal edge of the one or more semiconductor dies.

8. The semiconductor package of claim 1, wherein the semiconductor die includes a proximal edge, a distal edge opposite the proximal edge, and a first longitudinal edge and a second longitudinal edge extending between the proximal edge and the distal edge,
   wherein the one or more flow control dams include:
      a first flow control dam and a second flow control dam each positioned proximate the proximal edge of the semiconductor die;
      a third flow control dam and a fourth flow control dam each positioned proximate the distal edge of the semiconductor die;
      a fifth flow control dam positioned proximate the first lateral edge of the semiconductor die; and
      a sixth flow control dam positioned proximate the second lateral edge of the semiconductor die.

9. The semiconductor package of claim 1, wherein each of the one or more flow control dams are positioned between a first plurality of the bond wires and a second plurality of the bond wires.

10. The semiconductor package of claim 1, wherein the one or more flow control dams have a generally cubic shape, rectangular shape, spherical shape, cylindrical shape, pyramidal shape, conical shape, amorphous shape, or combinations thereof.

11. A semiconductor package, comprising:
    a substrate having a top planar surface and one or more flow control dams integrally formed with the top planar surface;
    at least one semiconductor die mounted on the top planar surface;
    one or more bond wires electrically connecting the at least one semiconductor die and the substrate;
    a mold compound encapsulating the at least one semiconductor die and the one or more bond wires, wherein the one or more flow control dams are configured to reduce the occurrence of wire sweep of the one or more bond wires; and
    two spacers offset from one another and having parallel side surfaces defining a tunnel configured to direct flow of at least a portion of the mold compound toward the one or more flow control dams,
    wherein the one or more flow control dams have a height that is less than a height of the two spacers.

12. The semiconductor package of claim 11, wherein the one or more flow control dams are formed from a solder mask integrally formed with the top planar surface of the substrate.

13. The semiconductor package of claim 11, wherein the one or more flow control dams includes a first flow control dam positioned on a first side of the one or more bond wires and a second flow control dam positioned on a second side of the one or more bond wires opposite the first side.

14. The semiconductor package of claim 11, wherein the one or more flow control dams are positioned proximate a corner of the at least one semiconductor die.

15. The semiconductor package of claim 11, wherein the one or more flow control dams each extend along a respective longitudinal axis that are at an oblique angle relative to a proximal edge of the at least one semiconductor die.

16. The semiconductor package of claim 11, wherein the one or more bond wires includes a first plurality of bond wires and a second plurality of bond wires, and wherein the one or more flow control dams are positioned between the first plurality of bond wires and the second plurality of bond wires.

17. The semiconductor package of claim 1, wherein the height of the one or more flow control dams is between 45% to 75% of the height of the two spacers.

18. The semiconductor package of claim 1, where the one or more flow control dams extend along an axis that is at an oblique angle relative to the parallel side surfaces of the two spacers.

19. The semiconductor package of claim 1, wherein the semiconductor die includes a central axis extending perpendicular to a proximal edge thereof and positioned equidistant between opposed side edges thereof, and wherein one of the two spacers is positioned along the central axis and another of the two spacers is offset from the central axis.

* * * * *